US012669849B2

(12) United States Patent
Go et al.

(10) Patent No.: US 12,669,849 B2
(45) Date of Patent: Jun. 30, 2026

(54) ELECTRONIC DEVICE INCLUDING PRINTED CIRCUIT BOARD

(71) Applicant: Samsung Electronics Co., Ltd., Suwon-si (KR)

(72) Inventors: Kwangeun Go, Suwon-si (KR); Kwangmin Gil, Suwon-si (KR); Taesik Kim, Suwon-si (KR); Minhyuk Nam, Suwon-si (KR); Myungjae Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 24 days.

(21) Appl. No.: 17/879,130

(22) Filed: Aug. 2, 2022

(65) Prior Publication Data

US 2022/0374051 A1     Nov. 24, 2022

Related U.S. Application Data

(63) Continuation of application No. PCT/KR2021/001417, filed on Feb. 3, 2021.

(30) Foreign Application Priority Data

Feb. 3, 2020     (KR) ........................ 10-2020-0012615

(51) Int. Cl.
*G06F 1/16* (2006.01)
*H05K 1/18* (2006.01)
*H05K 1/181* (2026.01)

(52) U.S. Cl.
CPC ........... *G06F 1/1658* (2013.01); *H05K 1/181* (2013.01); *H05K 2201/10393* (2013.01); *H05K 2201/10522* (2013.01)

(58) Field of Classification Search
CPC .................. G06F 1/1658; H05K 1/181; H05K 2201/10393; H05K 2201/10522;
(Continued)

(56) References Cited

U.S. PATENT DOCUMENTS

| 6,099,361 A | 8/2000 | Takanashi |
| 7,557,888 B2 * | 7/2009 | Oohira ................... H05K 1/189 |
| | | 349/149 |

(Continued)

FOREIGN PATENT DOCUMENTS

| CN | 1199253 A | 11/1998 |
| CN | 1624985 A | 6/2005 |

(Continued)

OTHER PUBLICATIONS

Extended European Search Report dated Jun. 2, 2023, issued in European Patent Application No. 21750963.7-1224.
(Continued)

*Primary Examiner* — Allen L Parker
*Assistant Examiner* — Keon Nmn Kim
(74) *Attorney, Agent, or Firm* — Jefferson IP Law, LLP

(57) ABSTRACT

An electronic device is provided. The electronic device includes a housing which includes a mounting portion and an inner wall portion extending in a first direction with respect to the mounting portion, a printed circuit board which includes an outer wall portion that is parallel to the inner wall portion of the housing, a clip member including a clip portion which is arranged at a position adjacent to the outer wall portion of the printed circuit board to be electrically connected to the printed circuit board and which protrudes toward the inner wall portion, a protruding guide which is spaced apart from the clip portion in a second direction that is opposite to the first direction, and which protrudes from the outer wall portion of the printed circuit (Continued)

board toward the inner wall portion of the housing, and a guide recess formed in the inner wall portion of the housing.

20 Claims, 16 Drawing Sheets

(58) Field of Classification Search
  CPC ... H05K 5/0018; H01Q 1/243; H04M 1/0249; H04M 1/0277; H04M 1/026
  See application file for complete search history.

(56) References Cited

U.S. PATENT DOCUMENTS

| | | | | |
|---|---|---|---|---|
| 8,643,806 | B2 * | 2/2014 | Yoo .................. | G02F 1/133308 |
| | | | | 362/621 |
| 10,477,675 | B1 | 11/2019 | Kim et al. | |
| 2005/0130506 | A1 | 6/2005 | Kato et al. | |
| 2009/0075501 | A1 | 3/2009 | Honda et al. | |
| 2012/0121117 | A1 | 5/2012 | Kim | |
| 2014/0085836 | A1 | 3/2014 | Mo et al. | |
| 2016/0056559 | A1 | 2/2016 | Iwabuchi et al. | |
| 2017/0054199 | A1 | 2/2017 | Gang et al. | |
| 2017/0062961 | A1 | 3/2017 | Fu et al. | |
| 2017/0111077 | A1 * | 4/2017 | Hwang .................. | H01Q 1/243 |
| 2017/0142823 | A1 | 5/2017 | Shim | |
| 2017/0188475 | A1 | 6/2017 | Lee et al. | |
| 2017/0290184 | A1 | 10/2017 | Kim et al. | |
| 2017/0373376 | A1 | 12/2017 | Jo et al. | |
| 2018/0063983 | A1 | 3/2018 | Ando et al. | |
| 2018/0287246 | A1 * | 10/2018 | Kim .......................... | H01Q 9/42 |
| 2018/0299929 | A1 * | 10/2018 | Kim ...................... | G06F 1/1635 |
| 2018/0310423 | A1 * | 10/2018 | Koo .......................... | H05K 5/04 |
| 2019/0188445 | A1 | 6/2019 | Chi et al. | |
| 2019/0309740 | A1 * | 10/2019 | Hattori .................... | F04B 35/04 |
| 2020/0176920 | A1 | 6/2020 | Jo et al. | |
| 2021/0014392 | A1 | 1/2021 | Jo et al. | |
| 2021/0184337 | A1 | 6/2021 | Lee et al. | |

FOREIGN PATENT DOCUMENTS

| | | | | |
|---|---|---|---|---|
| CN | 1819753 | A | 8/2006 | |
| CN | 102572027 | A | 7/2012 | |
| CN | 205039288 | U | 2/2016 | |
| CN | 107454742 | A | 12/2017 | |
| CN | 207022335 | U | 2/2018 | |
| CN | 208798002 | U * | 4/2019 | |
| EP | 1 691 593 | A1 | 8/2006 | |
| JP | 2007157357 | A * | 6/2007 | |
| JP | 2014-220114 | A | 11/2014 | |
| JP | 2016-046402 | A | 4/2016 | |
| KR | 10-2006-0024535 | A | 3/2006 | |
| KR | 10-2013-0098813 | A | 9/2013 | |
| KR | 10-2014-0039776 | A | 4/2014 | |
| KR | 10-2016-0019248 | A | 2/2016 | |
| KR | 10-2016-0127542 | A | 11/2016 | |
| KR | 10-1709532 | B1 | 2/2017 | |
| KR | 20170014340 | A * | 2/2017 | ............ H02K 5/225 |
| KR | 10-2017-0022442 | A | 3/2017 | |
| KR | 10-2017-0037464 | A | 4/2017 | |
| KR | 10-2017-0057954 | A | 5/2017 | |
| KR | 10-1759950 | B1 | 7/2017 | |
| KR | 10-2020-0001221 | A | 1/2020 | |
| KR | 10-2020-0002822 | A | 1/2020 | |
| WO | 2019/164242 | A1 | 8/2019 | |

OTHER PUBLICATIONS

Korean Office Action dated Nov. 13, 2023, issued in Korean Patent Application No. 10-2020-0012615.

Indian Office Action dated Dec. 19, 2023, issued in Indian Patent Application No. 202217044360.

Korean Decision of Patent with English translation dated Jun. 24, 2024; Korean Appln. No. 10-2020-0012615.

Chinese Office Action with English translation dated Jun. 28, 2024; Chinese Appln. No. 202180012800.3.

Indian Office Action dated Oct. 14, 2024; Indian Appln. No. 202217044360.

European Search Report dated Nov. 6, 2024; European Appln. No. 21 750 963.7-1218.

Chinese Office Action with English translation dated Nov. 29, 2024; Chinese Appln. No. 202180012800.3.

Chinese Notice of Allowance with English translation dated Feb. 14, 2025; Chinese Appln. No. 202180012800.3.

Korean Office Action with English translation dated Feb. 3, 2026; Korean Appln. No. 10-2024-0129348.

* cited by examiner (a)

(b)

(a)

(b)

ELECTRONIC DEVICE INCLUDING PRINTED CIRCUIT BOARD

CROSS-REFERENCE TO RELATED APPLICATION(S)

This application is a continuation application, claiming priority under § 365(c), of an International application No. PCT/KR2021/001417, filed on Feb. 3, 2021, which is based on and claims the benefit of a Korean patent application number 10-2020-0012615, filed on Feb. 3, 2020, in the Korean Intellectual Property Office, the disclosure of which is incorporated by reference herein in its entirety.

BACKGROUND

1. Field

The disclosure relates to an electronic device including a printed circuit board that prevents components included in the electronic device from being damaged in a process of assembling the electronic device.

2. Description of Related Art

Electronic devices, such as a smart phone, a tablet personal computer (PC), and a computer are becoming smaller, slimmer, and multifunctional.

As the electronic device gradually becomes smaller, components or fixtures contained in the electronic device may be assembled in close contact with each other or overlapped with each other in part.

An internal space of the electronic device may be designed based on an assembled state or configured based on an assembly process. As components contained in the electronic device are integrated and miniaturized, a space secured to consider the assembly of the electronic device is also gradually decreasing.

The above information is presented as background information only to assist with an understanding of the disclosure. No determination has been made, and no assertion is made, as to whether any of the above might be applicable as prior art with regard to the disclosure.

SUMMARY

When a worker manually assembles components or fixtures contained in an electronic device, two or more components or fixtures may be close to each other through various assembling flows depending on workers' assembling ways.

If a worker makes two or more components or fixtures close to each other with other assembling flow than a recommended assembling flow, the components or fixtures may be damaged in the assembly process due to unintentional contact between the components or fixtures.

Aspects of the disclosure are to address at least the above-mentioned problems and/or disadvantages and to provide at least the advantages described below. Accordingly, an aspect of the disclosure is to provide a printed circuit board having a structure that can prevent erroneous assembly problems, such as damage to components or fixtures or assembly defects in a worker's process of assembling an electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a mounting portion and an inner wall portion extending in a first direction with respect to the mounting portion, a printed circuit board mounted on the mounting portion of the housing and including an outer wall portion disposed parallel to the inner wall portion of the housing in a state of being mounted on the mounting portion of the housing, a clip member disposed at a position adjacent to the outer wall portion of the printed circuit board, electrically connected to the printed circuit board, and including a clip portion formed to protrude toward the inner wall portion to be in contact with the inner wall portion, a protrusion guide spaced apart from the clip portion in a second direction opposite to the first direction and formed to protrude from the outer wall portion of the printed circuit board toward the inner wall portion of the housing, and a guide groove formed in the inner wall portion of the housing to accommodate the protrusion guide in a state where the printed circuit board is mounted on the mounting portion of the housing.

In accordance with another aspect of the disclosure, a printed circuit board is provided. The printed circuit board includes an outer wall portion formed in the printed circuit board to be disposed parallel to an inner wall portion of a housing, the inner wall portion extending in a first direction with respect to a mounting portion of the housing, a clip member disposed at a position adjacent to the outer wall portion, electrically connected to the printed circuit board, and including a clip portion formed to protrude toward the inner wall portion of the housing to be in contact with the inner wall portion, and a protrusion guide spaced apart from the clip portion in a second direction opposite to the first direction, formed to protrude from the outer wall portion toward the inner wall portion of the housing, and inserted into a guide groove formed in the inner wall portion of the housing, wherein the printed circuit board may be mounted at least in part on the mounting portion of the housing.

In accordance with another aspect of the disclosure, an electronic device is provided. The electronic device includes a front plate forming a first surface of the electronic device, a display exposed to the outside of the electronic device in a first direction through at least a portion of the front plate, a rear plate forming a second surface of the electronic device opposite to the first surface, a side bezel structure including a first support member combined at least in part with the display and disposed between the front and rear plates to be combined with the front and rear plates, a printed circuit board including a clip portion formed to be electrically connected to the side bezel structure and combined with the first support member, and a protrusion guide formed on the printed circuit board to be spaced apart from the clip portion in a second direction opposite to the first direction and protruding toward the side bezel structure, wherein at least a partial area of the side bezel structure may be electrically connected to the clip portion to form an antenna area.

According to various embodiments of the disclosure, it is possible to prevent problems, such as damage to components or fixtures or assembly defects due to erroneous assembly of an electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in connection with the accompanying drawings, in which.

Throughout the drawings, it should be noted that like reference numbers are used to depict the same or similar elements, features, and structures.

DETAILED DESCRIPTION

Figure 1:
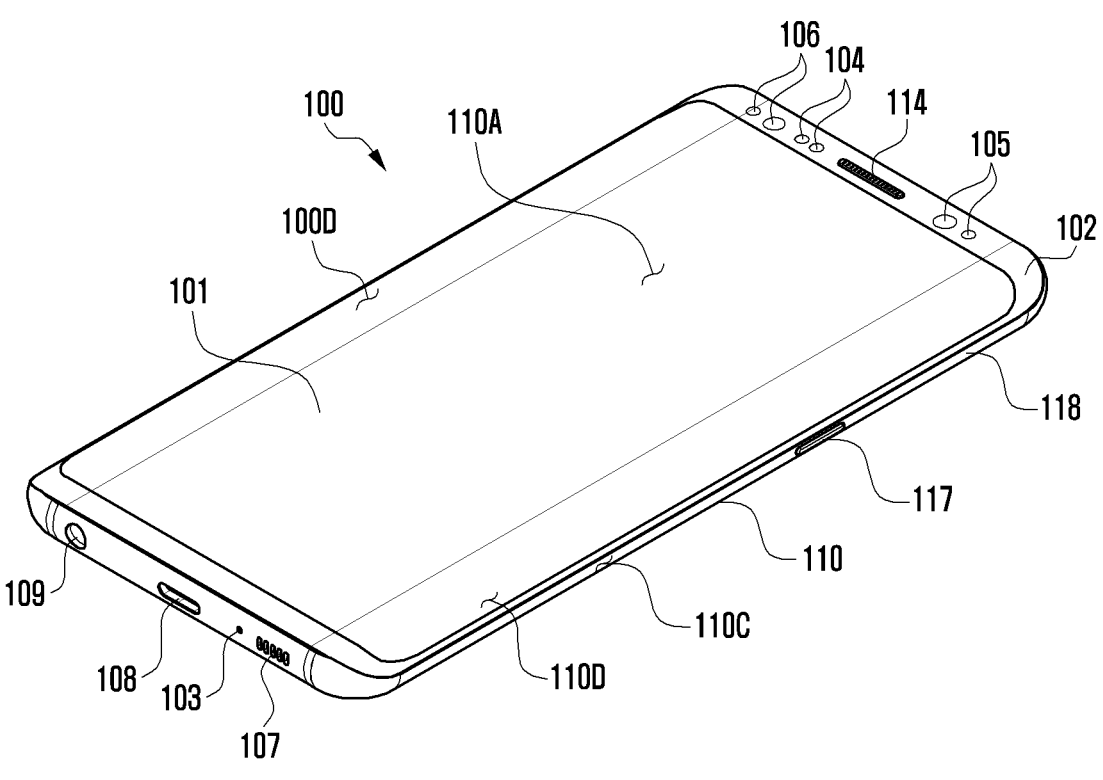
FIG. 1 is a perspective view illustrating a front surface of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Regarding the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

Figure 2:
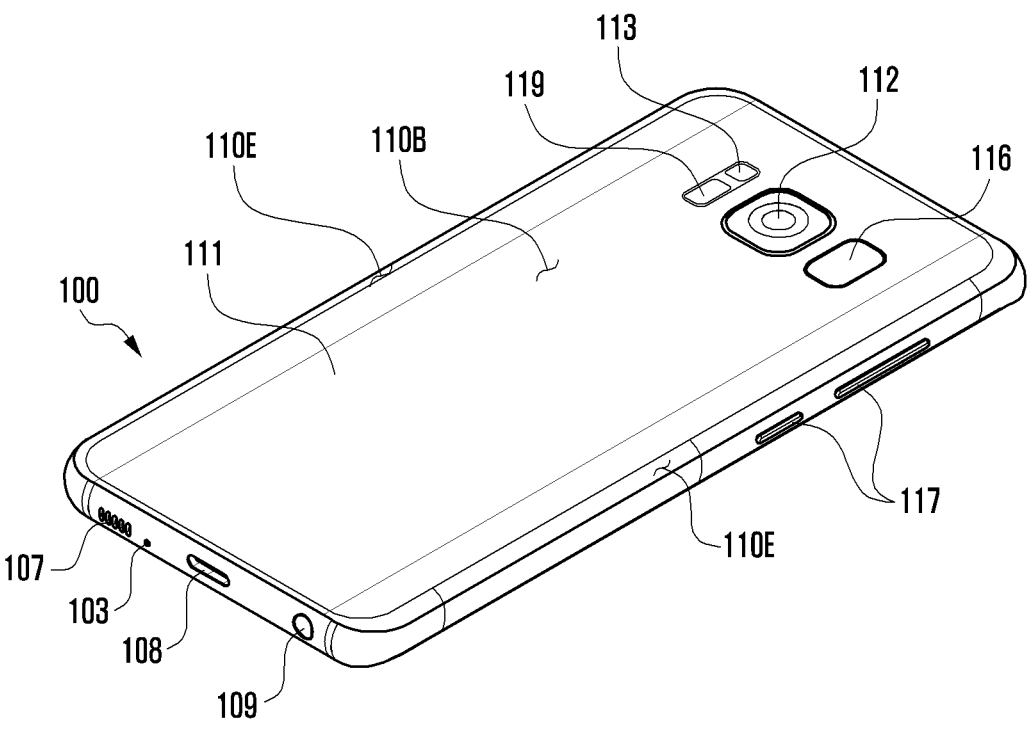
FIG. 2 is a perspective view illustrating a rear surface of an electronic device shown in FIG. 1 according to an embodiment of the disclosure.

FIG. 1 is a perspective view illustrating a front surface of an electronic device according to an embodiment of the disclosure. FIG. 2 is a perspective view illustrating a rear surface of an electronic device shown in FIG. 1 according to an embodiment of the disclosure.

Referring to FIGS. 1 and 2, a mobile electronic device 100 (e.g., an electronic device 101 of FIG. 1) according to various embodiments may include a housing 110 including a first surface (or front surface) 110A, a second surface (or rear surface) 110B, and a side surface 110C enclosing a space between the first surface 110A and the second surface 110B. In one embodiment (not illustrated), the housing may refer to a structure forming some of the first surface 110A, the second surface 110B, and the side surface 110C. According to one embodiment of the disclosure, the first surface 110A may be formed by an at least partially substantially transparent front plate 102 (e.g., a polymer plate or a glass plate including various coating layers). The second surface 110B may be formed by a substantially opaque rear plate 111. The rear plate 111 may be formed by, for example, coated or colored glass, ceramic, polymer, metal (e.g., aluminum, stainless steel (STS), or magnesium), or a combination of at least two of the above materials. The side surface 110C may be coupled to the front plate 102 and the rear plate 111 and be formed by a side bezel structure (or "side member") 118 including a metal and/or a polymer. In some embodiments of the disclosure, the rear plate 111 and the side bezel structure 118 may be integrally formed and include the same material (e.g., metal material, such as aluminum).

In the illustrated embodiment of the disclosure, the front plate 102 may include two first regions 110D bent and extended seamlessly from the first surface 110A toward the rear plate 111 at both ends of a long edge of the front plate 102. In the illustrated embodiment (see FIG. 2), the rear plate 111 may include two second regions 110E bent and extended seamlessly from the second surface 110B towards the front plate 102 at both ends of a long edge. In some embodiments of the disclosure, the front plate 102 (or the rear plate 111) may include only one of the first regions 110D (or the second regions 110E). In one embodiment of the disclosure, a portion of the first regions 110D or the second regions 110E may not be included. In the above embodiments of the disclosure, when viewed from the side surface of the mobile electronic device 100, the side bezel structure 118 may have a first thickness (or width) at a side surface in which the first region 110D or the second region 110E is not included and have a second thickness smaller than the first thickness at a side surface including the first region 110D or the second region 110E.

According to one embodiment of the disclosure, the mobile electronic device 100 may include at least one of a display 101, audio modules 103, 107, and 114, sensor modules 104, 116, and 119, camera modules 105 and 112, a key input device 117, a light emitting element 106, and connector holes 108 and 109. In some embodiments of the disclosure, the mobile electronic device 100 may omit at least one (e.g., the key input device 117 or the light emitting element 106) of the components or may further include other components.

The display 101 may be exposed through, for example, a substantial portion of the front plate 102. In some embodiments of the disclosure, at least part of the display 101 may be exposed through the front plate 102 forming the first region 110D of the side surface 110C and the first surface 110A. In some embodiments of the disclosure, an edge of the display 101 may be formed to be substantially the same as an adjacent outer edge shape of the front plate 102. In one embodiment (not illustrated), in order to enlarge an area where the display 101 is exposed, a distance between an outer edge of the display 101 and an outer edge of the front plate 102 may be formed to be substantially the same.

In an embodiment (not illustrated), in a portion of a screen display area of the display 101, a recess or an opening may be formed, and at least one of the audio module 114 and the sensor module 104, the camera module 105, and the light emitting element 106 aligned with the recess or the opening may be included. In one embodiment (not illustrated), at a rear surface of a screen display area of the display 101, at least one of the audio module 114, the sensor module 104, the camera module 105, the fingerprint sensor module 116, and the light emitting element 106 may be included. In one embodiment (not illustrated), the display 101 may be coupled to or disposed adjacent to a touch detection circuit, a pressure sensor capable of measuring intensity (pressure) of the touch, and/or a digitizer for detecting a stylus pen of a magnetic field method. In some embodiments of the disclosure, at least part of the sensor modules 104 and 119 and/or at least part of the key input device 117 may be disposed in a first region 110D and/or a second region 110E.

The audio modules 103, 107, and 114 may include a microphone hole 103 and speaker holes 107 and 114. The microphone hole 103 may dispose a microphone for obtaining an external sound therein, and, in some embodiments of the disclosure, a plurality of microphones may be disposed to detect a direction of a sound. The speaker holes 107 and 114 may include an external speaker hole 107 and a call receiver hole 114. In some embodiments of the disclosure, the speaker holes 107 and 114 and the microphone hole 103 may be implemented into one hole, or the speaker may be included without the speaker holes 107 and 114 (e.g., piezo speaker).

The sensor modules 104, 116, and 119 may generate an electrical signal or a data value corresponding to an operating state inside the mobile electronic device 100 or an environment state outside the mobile electronic device 100. The sensor modules 104, 116, and 119 may include, for example, a first sensor module 104 (e.g., proximity sensor) and/or a second sensor module (not illustrated) (e.g., fingerprint sensor), disposed at the first surface 110A of the housing 110, and/or a third sensor module 119 (e.g., a heart rate monitor (HRM) sensor) and/or a fourth sensor module 116 (e.g., fingerprint sensor), disposed at the second surface 110B of the housing 110. The fingerprint sensor may be disposed at the second surface 110B as well as the first surface 110A (e.g., the display 101) of the housing 110. The mobile electronic device 100 may further include a sensor module (not illustrated), for example, at least one of a gesture sensor, gyro sensor, air pressure sensor, magnetic sensor, acceleration sensor, grip sensor, color sensor, infrared (IR) sensor, biometric sensor, temperature sensor, humidity sensor, and illumination sensor 104.

The camera modules 105 and 112 may include a first camera device 305 disposed at the first surface 110A of the mobile electronic device 100, a second camera device 112 disposed at the second surface 110B thereof, and/or a flash 113. The camera modules 105 and 112 may include one or a plurality of lenses, an image sensor, and/or an image signal processor. The flash 113 may include, for example, a light emitting diode or a xenon lamp. In some embodiments of the disclosure, two or more lenses (infrared camera, wide angle and telephoto lens) and image sensors may be disposed at one surface of the mobile electronic device 100.

The key input device 117 may be disposed at the side surface 110C of the housing 110. In one embodiment of the disclosure, the mobile electronic device 100 may not include some or all of the above-described key input devices 117, and the key input device 117 that is not included may be implemented in other forms, such as a soft key on the display 101. In some embodiments of the disclosure, the key input device 117 may include a sensor module 116 disposed at the second surface 110B of the housing 110.

The light emitting element 106 may be disposed at, for example, the first surface 110A of the housing 110. The light emitting element 106 may provide, for example, status information of the mobile electronic device 100 in an optical form. In one embodiment of the disclosure, the light emitting element 106 may provide, for example, a light source interworking with an operation of the camera module 105. The light emitting element 106 may include, for example, a light emitting diode (LED), an IR LED, and a xenon lamp.

The connector ports 108 and 109 may include a first connector port 108 that may receive a connector (e.g., a universal serial bus (USB) connector) for transmitting and receiving power and/or data to and from an external electronic device and/or a second connector hole (e.g., earphone jack) 109 that can receive a connector for transmitting and receiving audio signals to and from an external electronic device.

Figure 3:
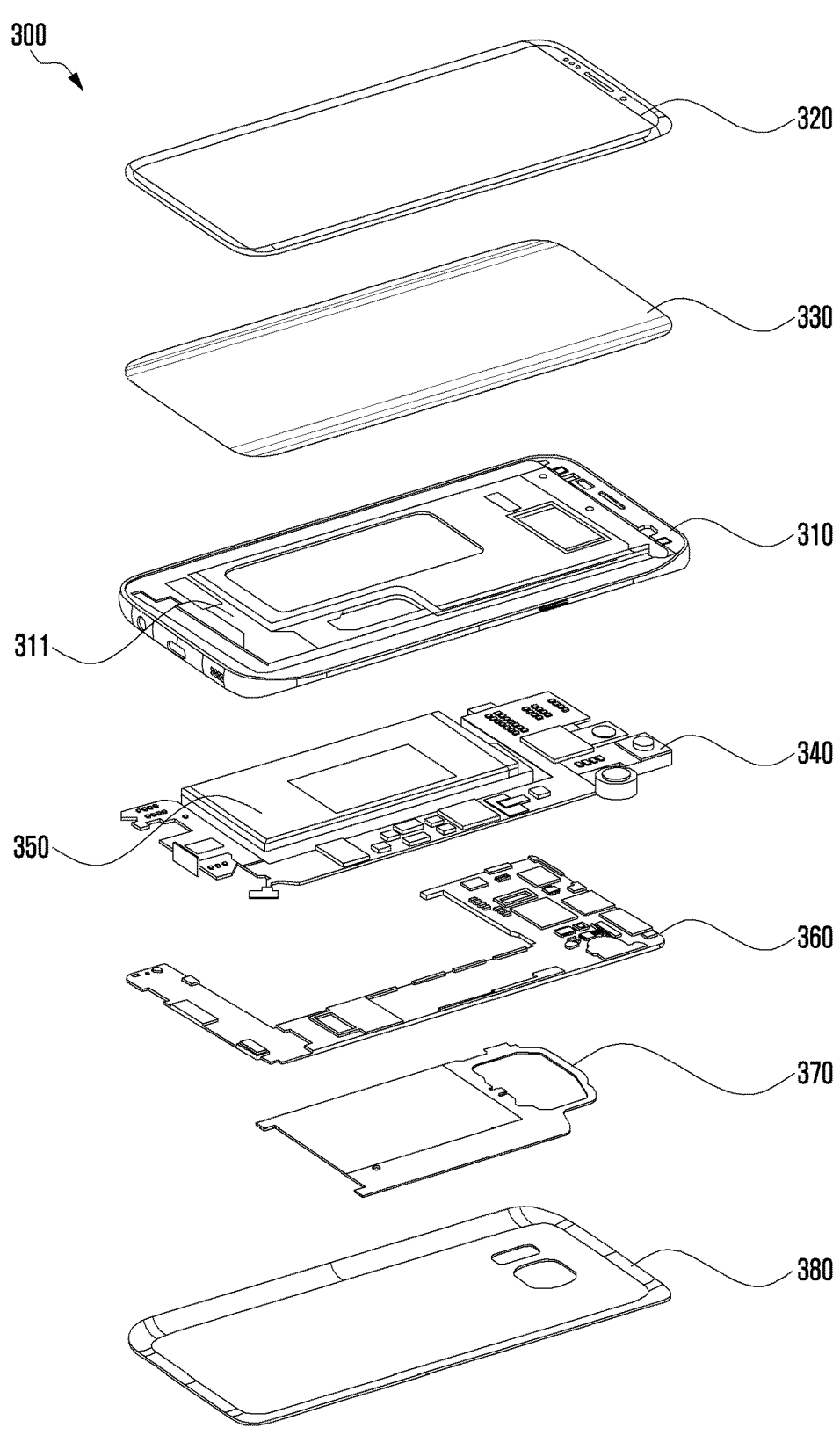
FIG. 3 is an exploded perspective view illustrating an electronic device shown in FIG. 1 according to an embodiment of the disclosure.

FIG. 3 is an exploded perspective view illustrating an electronic device shown in FIG. 1 according to an embodiment of the disclosure.

Referring to FIG. 3, a mobile electronic device 300 (e.g., the mobile electronic device 100 of FIG. 1) may include a side bezel structure 310 (e.g., part of side surface 110C of FIG. 1), a first support member 311 (e.g., bracket), front plate 320, display 330 (e.g., display 1 of FIG. 1), a printed circuit board 340, a battery 350, a second support member 360 (e.g., rear case), an antenna 370, and a rear plate 380. In some embodiments of the disclosure, the electronic device 300 may omit at least one (e.g., the first support member 311 or the second support member 360) of the components or may further include other components. At least one of the components of the electronic device 300 may be the same as or similar to at least one of the components of the mobile electronic device 300 of FIG. 1 or 2 and a duplicated description is omitted below.

The first support member 311 may be disposed inside the electronic device 300 to be connected to the side bezel structure 310 or may be integrally formed with the side bezel structure 310. The first support member 311 may be made of, for example, a metal material and/or a non-metal (e.g., polymer) material. In the first support member 311, the display 330 may be coupled to one surface thereof, and the printed circuit board 340 may be coupled to the other surface thereof. In the printed circuit board 340, a processor, a memory, and/or an interface may be mounted. The processor may include, for example, one or more of a central processing unit, application processor, graphic processing unit, image signal processor, sensor hub processor, or communication processor. In addition, the printed circuit board 340 may include, for example, a conductive member (e.g., a clip part) electrically connected to the side bezel structure 310, and contact at least a portion of the side bezel structure 310. A guide member (e.g., a protruding guide) may be formed.

The memory may include, for example, a volatile memory or a nonvolatile memory.

The interface may include, for example, a high definition multimedia interface (HDMI), USB interface, secure digital (SD) card interface, and/or audio interface. The interface may, for example, electrically or physically connect the electronic device 300 to an external electronic device and include a USB connector, an SD card/multimedia card (MMC) connector, or an audio connector.

The battery 350 is a device for supplying power to at least one component of the electronic device 300 and may include, for example, a non-rechargeable primary battery, a rechargeable secondary battery, or a fuel cell. At least part of the battery 350 may be disposed, for example, on substantially the same plane as that of the printed circuit board 340. The battery 350 may be integrally disposed inside the electronic device 300 or may be detachably disposed in the electronic device 300.

The antenna 370 may be disposed between the rear plate 380 and the battery 350. The antenna 370 may include, for example, a near field communication (NFC) antenna, wireless charging antenna, and/or magnetic secure transmission (MST) antenna. The antenna 370 may perform, for example, short range communication with an external device or may wirelessly transmit and receive power required for charging. In one embodiment of the disclosure, an antenna structure may be formed by some or a combination of the side bezel structure 310 and/or the first support member 311. For example, at least a part of the side bezel structure 310 may be electrically connected to a conductive member (e.g., a clip part) to form an antenna area.

Figure 4A:
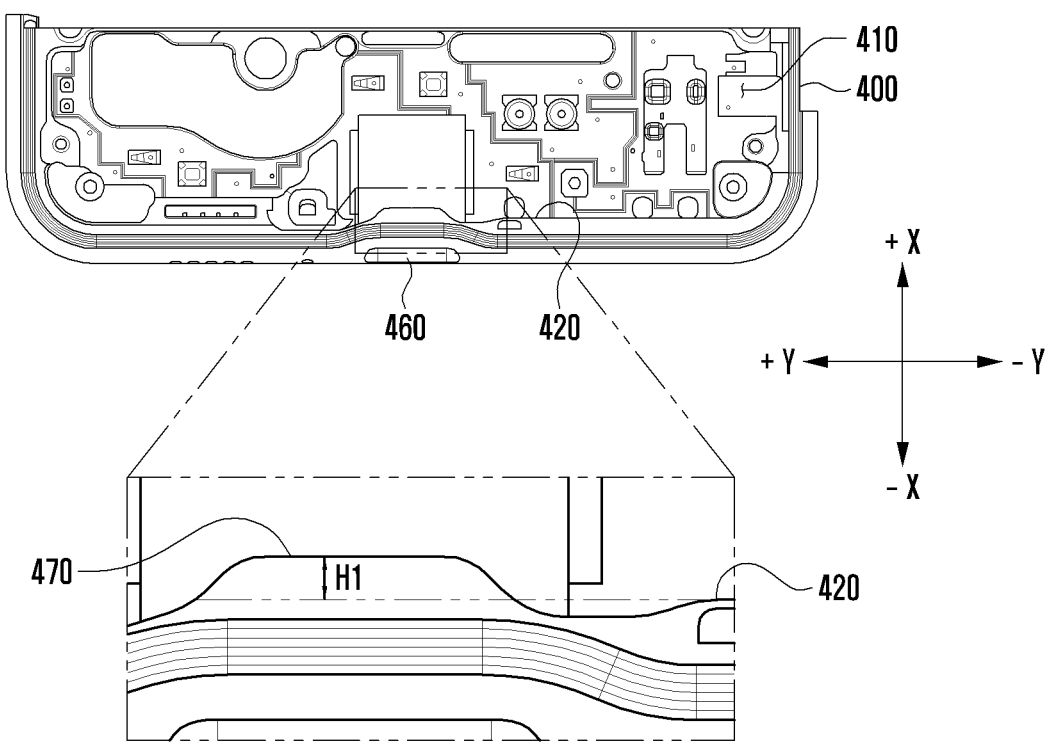
FIG. 4A is a plan view illustrating a part of a housing according to an embodiment of the disclosure.
Figure 4B:
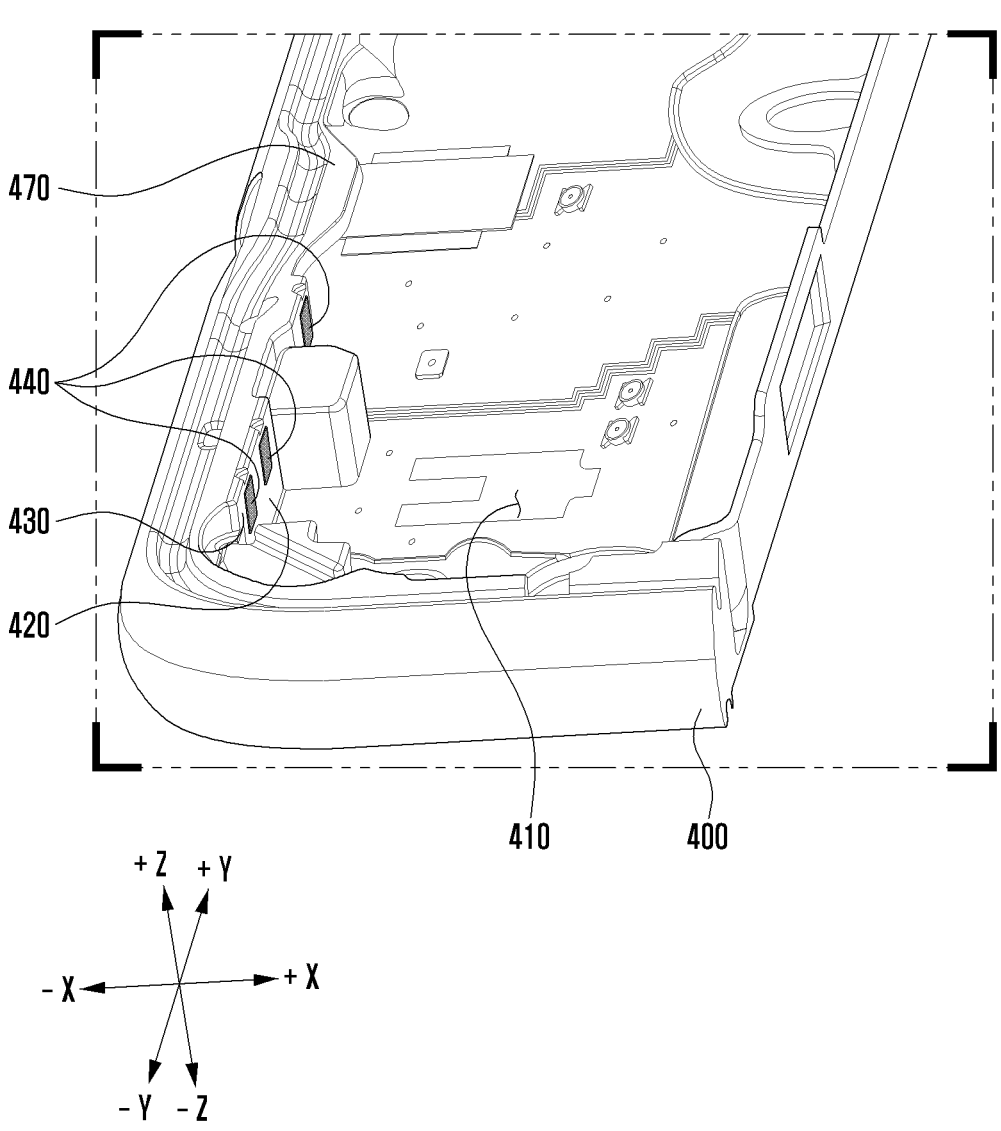
FIG. 4B is a perspective view illustrating a part of a housing shown in FIG. 4A according to an embodiment of the disclosure.
Figure 4C:
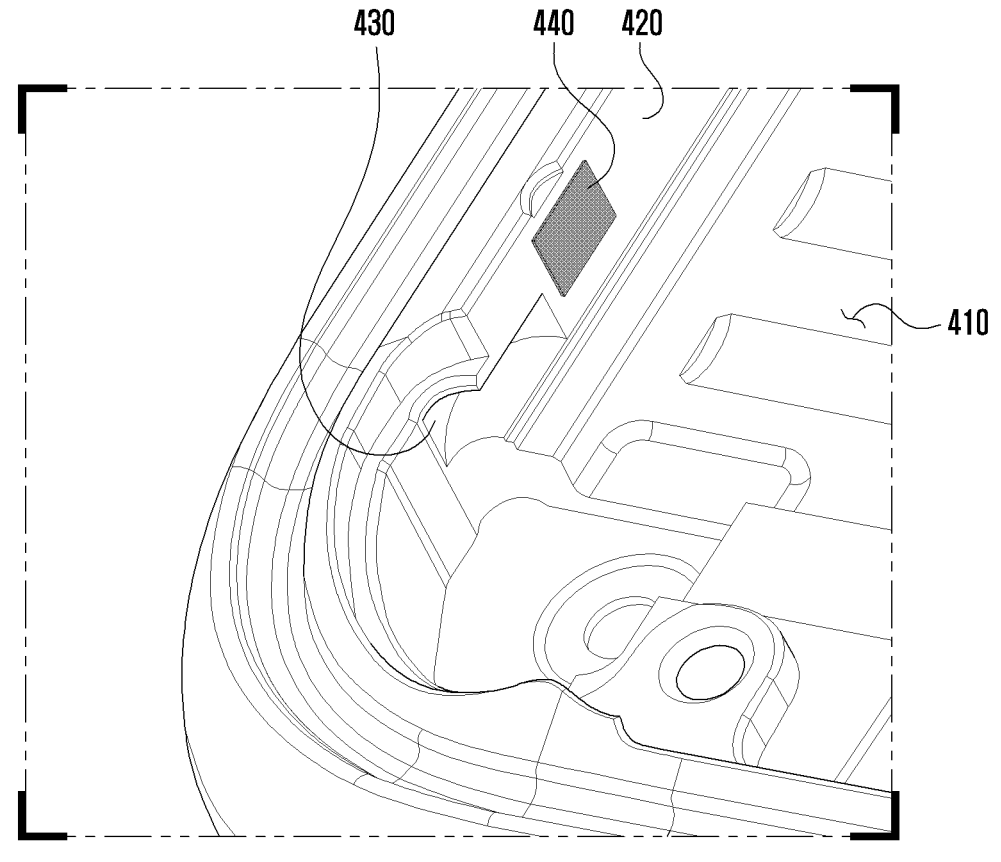
FIG. 4C is an enlarged perspective view illustrating a part of a housing shown in FIG. 4A according to an embodiment of the disclosure.

FIG. 4A is a plan view illustrating a part of a housing according to an embodiment of the disclosure. FIG. 4B is a perspective view illustrating a part of a housing shown in FIG. 4A according to an embodiment of the disclosure. FIG. 4C is an enlarged perspective view illustrating a part of a housing shown in FIG. 4A according to an embodiment of the disclosure.

According to various embodiments of the disclosure, the electronic device (e.g., the electronic device 100 in FIG. 1) of this embodiment may include a housing (e.g., the housing 110 in FIG. 1) in which components included in the electronic device are accommodated, combined, or installed.

Referring to FIG. 4A, a certain part of a housing 400 according to various embodiments is illustrated. For example, when a direction to which a display (e.g., the display 101 in FIG. 1) included in the electronic device faces is a front direction, the part of the housing 400 shown in FIG. 4A may be a part including side portions of the electronic device having a rectangular form.

According to various embodiments of the disclosure, the housing 400 may have a region formed of a conductive material. For example, at least a partial region of the housing 400 may be formed of a metal material. The housing 400 may be segmented into a plurality of regions. For example, the housing 400 may be formed generally of a metal material, and a partial region of the housing 400 may be formed of an insulating material, so that the housing 400 may be segmented into a plurality of regions electrically disconnected from each other.

According to various embodiments of the disclosure, the housing 400 has a mounting portion 410 formed to allow a printed circuit board (e.g., the printed circuit board 340 in FIG. 3 or a printed circuit board 500 in FIG. 5A) to be mounted. The mounting portion 410 of the housing 400 may be formed in a shape substantially corresponding to the printed circuit board so that the printed circuit board can be mounted thereon. According to various embodiments of the disclosure, the mounting portion 410 may have an area similar to or greater than that of the printed circuit board.

According to various embodiments of the disclosure, the housing 400 may have an inner wall portion 420 extending from the mounting portion 410. The inner wall portion 420 may be formed to extend in a first direction with respect to the mounting portion 410. For example, the first direction may be the positive Z direction with reference to FIG. 4B. The inner wall portion 420 extending in the first direction with respect to the mounting portion 410 may be one of side portions of the housing 400. The inner wall portion 420 may be formed of the same material as the housing 400. The extending length of the inner wall portion 420 or the height of the inner wall portion 420 may be determined depending on the size or volume of electronic components mounted on the mounting portion 410 of the housing 400.

According to various embodiments of the disclosure, a guide groove 430 may be formed in the inner wall portion 420 of the housing 400. With reference to FIG. 4C, the guide groove 430 may be concavely formed in the inner wall portion 420. For example, the guide groove 430 may be formed in the inner wall portion 420 to be concave in the negative X direction of FIG. 4B. Into the guide groove 430, a protrusion guide (e.g., a protrusion guide 530 in FIG. 5A) to be described later may be inserted. The guide groove 430 may be formed to substantially correspond to the protrusion guide 530. The length and width of the guide groove 430 may be determined depending on the shape of the protrusion guide 530. In addition, the shape of the guide groove 430 may be determined based on various design factors.

According to various embodiments of the disclosure, a guide portion (not shown) may be formed on the inner wall portion 420 of the housing 400. The guide portion (not shown) may be convexly formed on the inner wall portion 420. For example, the guide portion (not shown) may be formed on the inner wall portion 420 to be convex in the positive X direction of FIG. 4B, and it may be engaged with the printed circuit board (e.g., the printed circuit board 340 in FIG. 3 or the printed circuit board 500 in FIG. 5A). The length and width of the guide portion (not shown) may be determined depending on the shape of an engaging portion (not shown) of the printed circuit board. In addition, the shape of the guide portion (not shown) may be determined based on various design factors.

According to various embodiments of the disclosure, a pad portion 440 formed of a conductive material may be disposed on at least a portion of the inner wall portion 420 of the housing 400. In a state where the printed circuit board is mounted on the mounting portion 410 of the housing 400, the pad portion 440 may contact a clip portion (e.g., a clip portion 521 in FIG. 5A) of a clip member (e.g., a clip member 520 in FIG. 5A) to be described later.

According to various embodiments of the disclosure, an opening portion 460 may be formed in at least a part of the inner wall portion 420 of the housing 400. Into the opening portion 460, a connector (e.g., a connector 540 in FIG. 5A) to be described later may be inserted. In order to accommodate the connector, the opening portion 460 may be formed in the inner wall portion 420 in a shape substantially corresponding to the connector.

Referring to FIG. 4B, a shoulder portion 470 that protrudes in a direction (e.g., the positive X direction in FIG. 4B) from the inner wall portion 420 toward the mounting portion 410 may be formed on the inner wall portion 420 adjacent to the opening portion 460. The shoulder portion 470 may be formed to start from the inner wall portion 420 adjacent to the opening portion 460 in the first direction (e.g., the positive Z direction in FIG. 4B) and protrude in a direction toward the mounting portion 410. For example, the shape (e.g., length) of the shoulder portion 470 protruding in the direction (e.g., the positive X direction in FIG. 4B) toward the mounting portion 410 may be determined based on the shape of the connector (e.g., the connector 540 in FIG. 5A) or the clip portion (e.g., the clip portion 521 in FIG. 5A). For example, the length of the shoulder portion 470 may refer to a length (e.g., H1 in FIG. 4A) from the inner wall portion 420 to the end of the shoulder portion 470. For example, the length of the shoulder portion 470 may be greater than the length (e.g., H2 in FIG. 5B) at which the clip portion (e.g., the clip portion 521 in FIG. 5A) protrudes in the negative X direction. When the printed circuit board is brought close to the mounting portion 410 of the housing 400 in the second direction (e.g., the negative Z direction in FIG. 4B), the connector coupled to the printed circuit board may be caught by the shoulder portion 470. In the assembly process of mounting the printed circuit board on the mounting portion 410 of the housing 400, the shoulder portion 470 may limit an assembly flow so that the printed circuit board is approaching in a state of being spaced apart from the inner wall portion 420 of the housing 400. For example, the printed circuit board may need to approach the housing 400 in the second direction in a state of being spaced apart from the inner wall portion 420 of the housing 400 in the positive X direction shown in FIG. 4B.

According to various embodiments of the disclosure, the housing 400 may not include the shoulder portion 470.

Figure 5A:
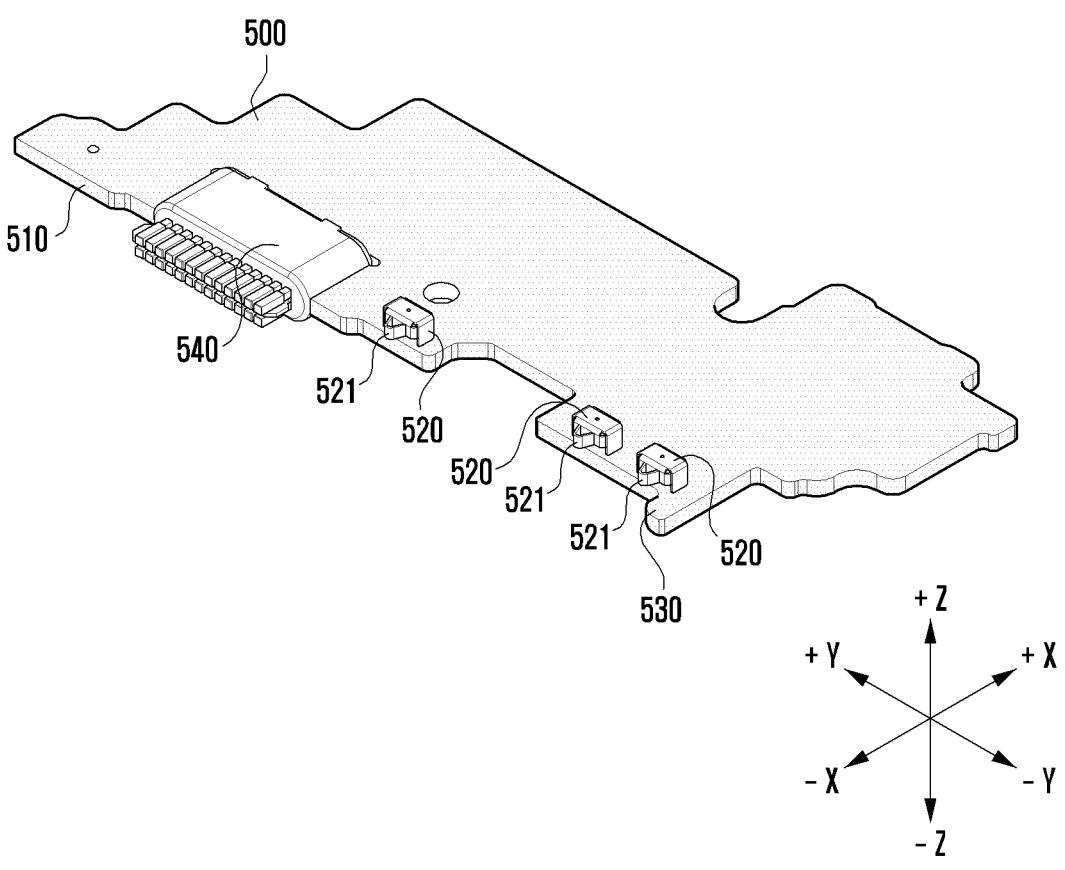
FIG. 5A is a perspective view illustrating a printed circuit board according to an embodiment of the disclosure.
Figure 5B:
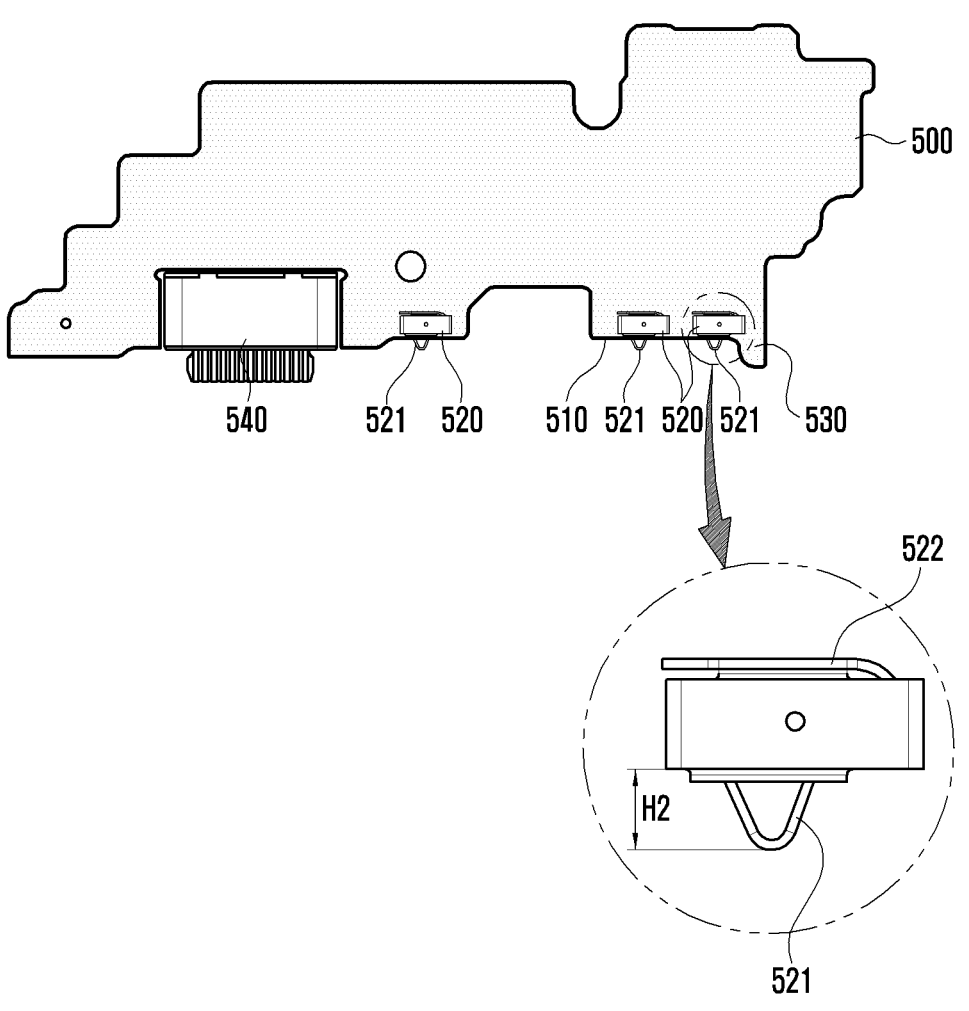
FIG. 5B is a plan view illustrating a printed circuit board shown in FIG. 5A according to an embodiment of the disclosure.

FIG. 5A is a perspective view illustrating a printed circuit board according to an embodiment of the disclosure. FIG. 5B is a plan view illustrating a printed circuit board shown in FIG. 5A according to an embodiment of the disclosure.

Referring to FIGS. 5A and 5B, according to various embodiments of the disclosure, a printed circuit board 500 shown in FIG. 5A may be mounted on the mounting portion 410 of the housing 400 shown in FIG. 4A.

According to various embodiments of the disclosure, electronic components performing various functions may be mounted on and electrically connected to the printed circuit board 500. For example, a connector 540 and a clip member 520 may be installed on the printed circuit board 500. The electronic components installed on the printed circuit board 500 may be electrically connected by conductive lines formed on the printed circuit board 500 in a printed manner. The printed circuit board 500 shown in FIG. 5A may be one of printed circuit boards included in the electronic device (e.g., the electronic device 101 in FIG. 1).

According to various embodiments of the disclosure, the printed circuit board 500 may include an outer wall portion 510. The outer wall portion 510 refers to one side surface of the printed circuit board 500 disposed substantially parallel to the inner wall portion 420 of the housing 400 in a state where the printed circuit board 500 is mounted on the mounting portion 410 of the housing 400. When the printed circuit board 500 is mounted on the mounting portion 410 of the housing 400, the inner wall portion 420 of the housing 400 and the outer wall portion 510 of the printed circuit board 500 may be in a state of facing each other at least in part.

According to various embodiments of the disclosure, the clip member 520 installed on the printed circuit board 500 may transmit an electrical signal moving through the conductive line printed on the printed circuit board 500 to a component in contact with the clip portion 521 of the clip member 520 or transmit an electrical signal of a component in contact with the clip portion 521 of the clip member 520 to the conductive line printed on the printed circuit board 500. For example, the clip member 520 may transmit an antenna signal. The clip member 520 may be electrically connected to an antenna feed (not shown) or a ground (not shown) for generating or receiving an antenna signal.

As shown in FIGS. 5A and 5B, the clip member 520 may be disposed at a position adjacent to the outer wall portion 510 of the printed circuit board 500. The clip portion 521 of the clip member 520 may be formed to protrude toward the inner wall portion 420 of the housing 400 (e.g., in the negative X direction in FIG. 5A). In a state where the printed circuit board 500 is mounted on the mounting portion 410 of the housing 400, the clip portion 521 of the clip member 520 may contact the inner wall portion 420 of the housing 400. In case that the pad portion 440 is disposed on the inner wall portion 420 of the housing 400, the clip portion 521 may contact the pad portion 440. A plurality of clip portions 521 and clip members 520 may be provided and arranged along the outer wall portion 510 of the printed circuit board 500.

According to various embodiments of the disclosure, the connector 540 installed on the printed circuit board 500 may include a universal serial bus (USB) connector 540. For example, the connector 540 may be a USB C-type connector 540. The connector 540 may be used for a wired connection between an external electronic device and the electronic device. The connector 540 may be disposed at a position adjacent to the outer wall portion 510 of the printed circuit board 500. At least a part of the connector 540 may protrude toward the inner wall portion 420 of the housing 400 (e.g., in the negative X direction in FIG. 5A). The connector 540 may be inserted into an opening portion (e.g., the opening portion 460 in FIG. 4A) formed in the inner wall portion 420 of the housing 400 described above. In a state where the connector 540 is inserted into the opening portion 460, the connector 540 may be exposed at least in part to the outside of the electronic device.

According to various embodiments of the disclosure, a protrusion guide 530 may be formed on the printed circuit board 500. The protrusion guide 530 may protrude in substantially the same direction as the clip portion 521 of the clip member 520 (e.g., the negative X direction in FIG. 5A). The protrusion guide 530 may start from the outer wall portion 510 of the printed circuit board 500 and extend toward the inner wall portion 420 of the housing 400. The protrusion guide 530 may be formed at a position spaced apart from the clip portion 521 of the clip member 520 in the second direction (e.g., the negative Z direction in FIG. 5A). When the printed circuit board 500 approaches the mounting portion 410 of the housing 400 in the second direction, the protrusion guide 530 may contact the inner wall portion 420 of the housing 400 before the clip portion 521 of the clip member 520. For this reason, the risk that the clip portion 521 of the clip member 520 is caught by the inner wall portion 420 and thereby damaged in the assembly process of the printed circuit board 500 may be prevented. A protrusion degree of the protrusion guide 530 may be greater than a protrusion degree of the clip portion 521. For example, a length (e.g., L1 in FIG. 8C) from the outer wall portion 510 of the printed circuit board 500 to the end of the protrusion guide 530 may be greater than a length (e.g., L2 in FIG. 8C) from the outer wall portion 510 of the printed circuit board 500 to the end of the clip portion 521. In addition, the protrusion guide 530 may be formed at a position spaced apart from the clip portion 521 of the clip member 520 in the third direction (e.g., the positive Z direction in FIG. 5A).

In an embodiment of the disclosure, the protrusion guide 530 may be formed integrally with the printed circuit board 500. The protrusion guide 530 may refer to a portion protruding from the outer wall portion 510 of the printed circuit board 500. In another embodiment of the disclosure, the protrusion guide may be a separate component installed on the printed circuit board. The protrusion guide installed on the printed circuit board may protrude toward the inner wall portion 420 of the housing 400.

According to various embodiments of the disclosure, the shape of the protrusion guide 530 may be formed to be substantially engaged with the shape of the guide groove (e.g., the guide groove 430 in FIG. 4B). For example, in case that the shape of the guide groove is a semicircle, the protrusion guide 530 may be formed in a semicircular shape so that the guide groove and the protrusion guide are engaged (e.g., contacted). In addition, the protrusion guide 530 may be formed in various shapes (e.g., semicircular, oval, square, asymmetrical, etc.) to facilitate the process of assembling the printed circuit board 500 with respect to the housing 400 by a worker.

According to various embodiments of the disclosure, the protrusion guide 530 may be disposed at a position adjacent to at least one of the clip portion 521 and the clip member 520. In one embodiment of the disclosure, the protrusion guide 530 may be formed to protrude toward (e.g., in the negative X direction in FIG. 5A) the inner wall portion 420 of the housing 400 from the end of the outer wall portion 510 of the printed circuit board 500 or the edge portion of the printed circuit board 500. The end of the outer wall portion 510 or the edge portion may refer to an end portion of the outer wall portion 510 in the extension direction of the outer wall portion 510 (e.g., the positive/negative Y axis directions in FIG. 5A). The outer wall portion 510 may be one side surface of the printed circuit board 500 substantially facing the inner wall portion 420 of the housing 400, so the end of the outer wall portion 510 or the edge portion may refer to both ends of one side surface of the printed circuit board 500 facing the inner wall portion 420 of the housing 400.

According to various embodiments of the disclosure, the protrusion guide 530 may be inserted into the guide groove 430 formed in the inner wall portion 420 of the housing 400.

Figure 6A:
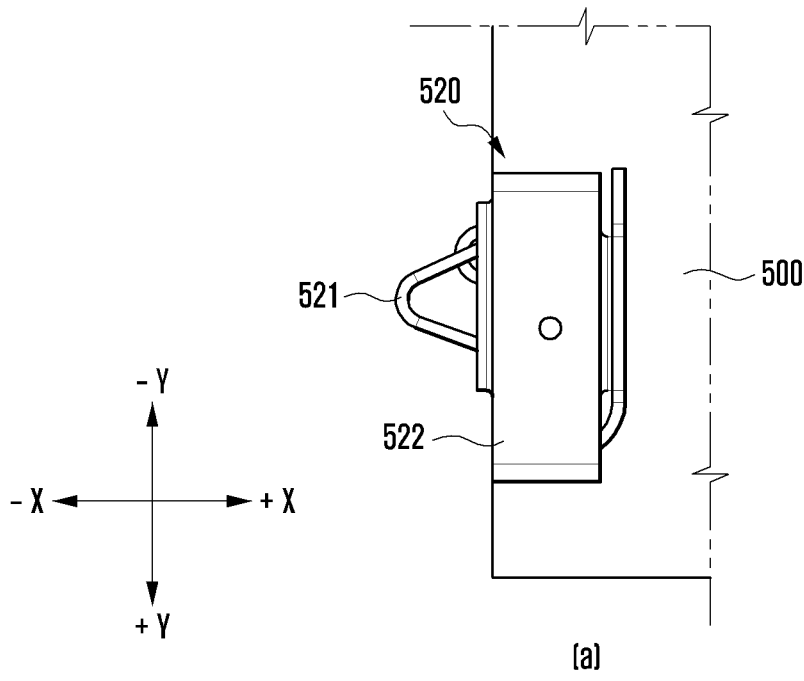
FIGS. 6A and 6B are views illustrating clip members according to various embodiments of the disclosure.
Figure 6A:
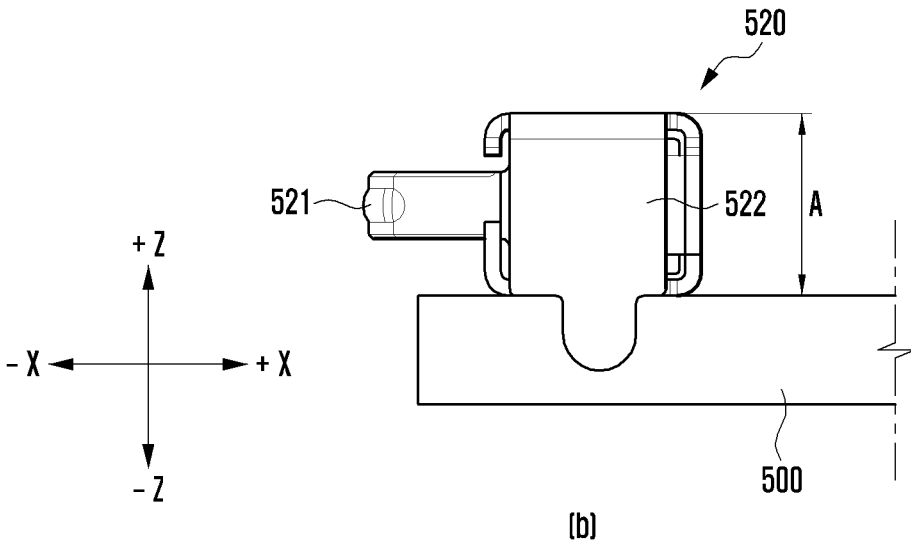
Figure 6B:
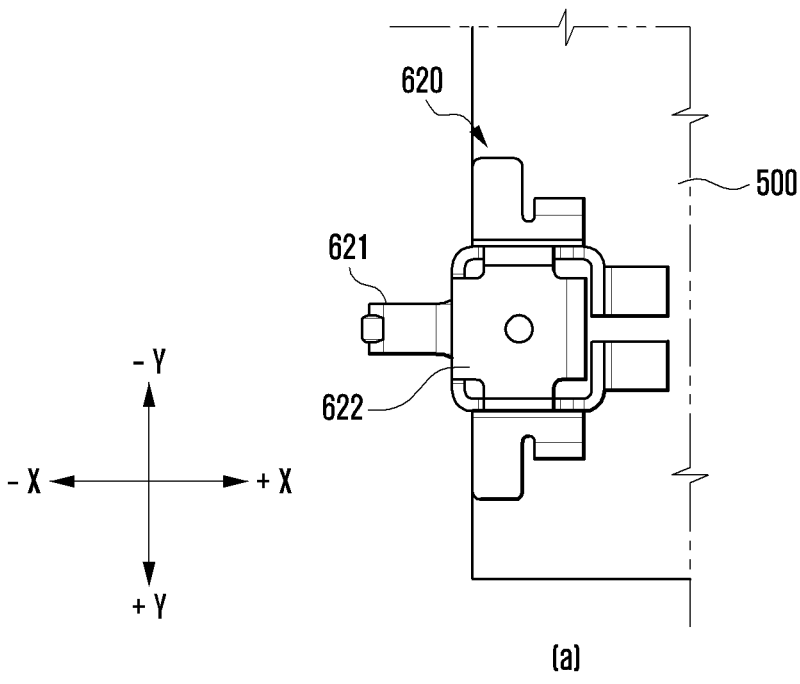
Figure 6B:
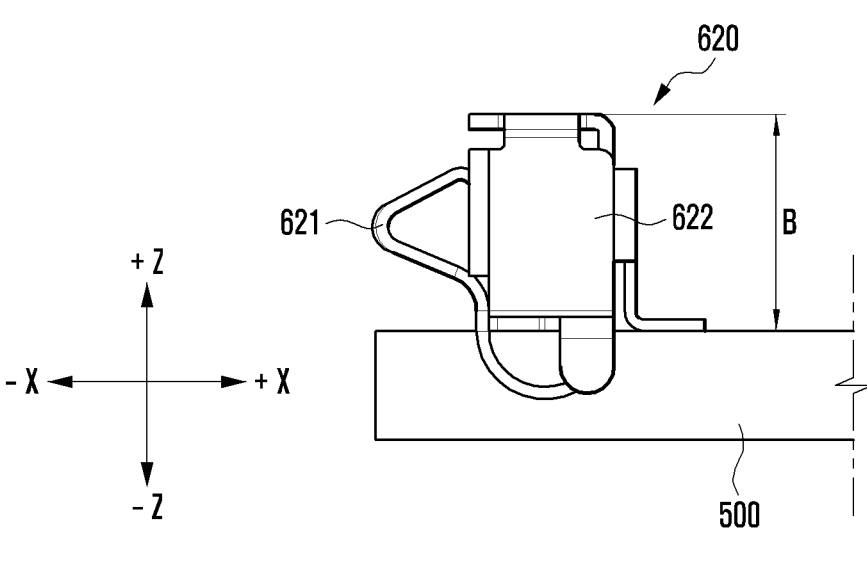

FIGS. 6A and 6B are views illustrating clip members according to various embodiments of the disclosure. In FIGS. 6A and 6B, part (a) illustrates plan views of the clip member, and part (b) shows side views of the clip member.

Referring to FIGS. 6A and 6B, according to various embodiments of the disclosure, the clip member 520 or 620 may include a body portion 522 or 622 and a clip portion 521 or 621. For example, the body portion 522 or 622 may be installed on the printed circuit board 500. The body portion 522 or 622 installed on the printed circuit board 500 allows the clip member 520 or 620 to be fixed on the printed circuit board 500. In addition, for example, the clip portion 521 or 621 is mounted on the printed circuit board 500 and may transmit an electrical signal moving through a conductive line printed on the printed circuit board 500 to a component in contact with the clip portion 521 or 621 or transmit an electrical signal of a component in contact with the clip portion 521 or 621 to a conductive line printed on the printed circuit board 500.

Hereinafter, the clip member 520 shown in FIG. 6A will be referred to as a first clip member 520, the clip portion included in the first clip member 520 will be referred to as a first clip portion 521, and the body portion included in the first clip member 520 will be referred to as a first body portion 522. The clip member 620 shown in FIG. 6B will be referred to as a second clip member 620, the clip portion included in the second clip member 620 will be referred to as a second clip portion 621, and the body portion included in the second clip member 620 will be referred to as a second body portion 622.

According to various embodiments of the disclosure, when the printed circuit board 500 is mounted on the mounting portion 410 of the housing 400, the clip portions 521 and 621 of the clip members 520 and 622 may be pressed against the inner wall portion 420 of the housing 400 and thereby elastically deformed. For example, as shown in part (a) of FIG. 6A, the first clip portion 521 may be formed to extend in a direction (e.g., the positive/negative Y axis directions in FIG. 6A) parallel to the extending direction of the printed circuit board 500. A part of the first clip portion 521 may be bent, and both ends of the first clip portion 521 may be installed on the first body portion 522. The shape of the first clip portion 521 is not limited to the illustrated embodiment of the disclosure, and according to various embodiments of the disclosure, the shape of the first clip portion 521 may vary. For example, the first clip portion 521 may have, but not limited to, a shape bent once, but it may be bent multiple times (e.g., three times) or formed in a concave-convex shape.

According to various embodiments of the disclosure, as shown in part (b) of FIG. 6B, the second clip portion 621 may be formed to extend in a direction (e.g., the positive/negative Z axis directions in FIG. 6B) perpendicular to the extending direction of the printed circuit board 500. A part of the second clip portion 621 may be bent, and both ends of the second clip portion 621 may be installed on the second body portion 622.

Referring to FIGS. 6A and 6B, the height A of the first clip member 520 may be lower than the height B of the second clip member 620. Here, the height may refer to the length A or B from the surface of the printed circuit board 500 to the point where the body portion 522 or 622 of the clip member 520 or 620 ends. In case that the first clip member 520 is used, the thickness of the electronic device may be reduced compared to a case where the second clip member 620 is used.

Referring to part (b) of FIG. 6B, the second clip portion 621 may have an inclined surface formed in the Z-axis direction by bending. In case that the printed circuit board 500 approaches the mounting portion 410 of the housing 400 in the second direction (e.g., the negative Z direction in part (b) of FIG. 6B), the second clip portion 621 may be gradually pressed against the inner wall portion 420 of the housing 400. Referring to part (a) of FIG. 6A, the first clip portion 521 may have an inclined surface formed in the Y-axis direction by bending. In case that the printed circuit board 500 approaches the mounting portion 410 of the housing 400 in the second direction (e.g., the negative Z direction in part (b) of FIG. 6B), the first clip portion 521 may be damaged by being caught on the inner wall portion 420 of the housing 400. The clip member 520 including the first clip portion 521 may have the risk of being damaged, depending on an approach direction of the printed circuit board 500 including the clip member 520 toward the housing 400 caused by a worker.

The electronic device and the printed circuit board 500 included therein according to various embodiments of the disclosure can prevent damage to the clip member 520 including the clip portion 521 shaped, such as the first clip portion 521 in the process of assembling the printed circuit board 500 with respect to the housing 400 by a worker.

Figure 7:
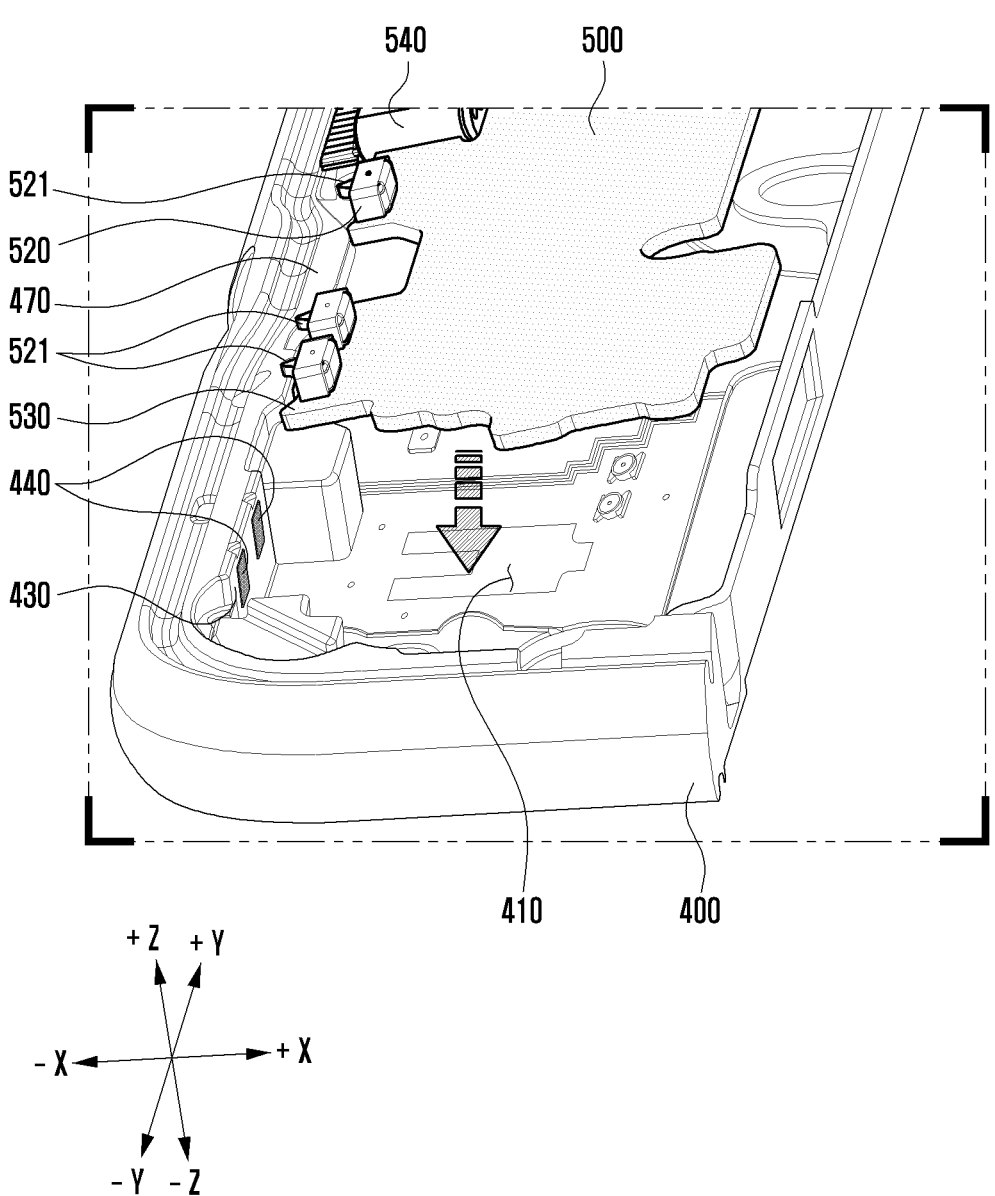
FIG. 7 is a view illustrating an assembly aspect of a housing and a printed circuit board according to an embodiment of the disclosure.
Figure 8A:
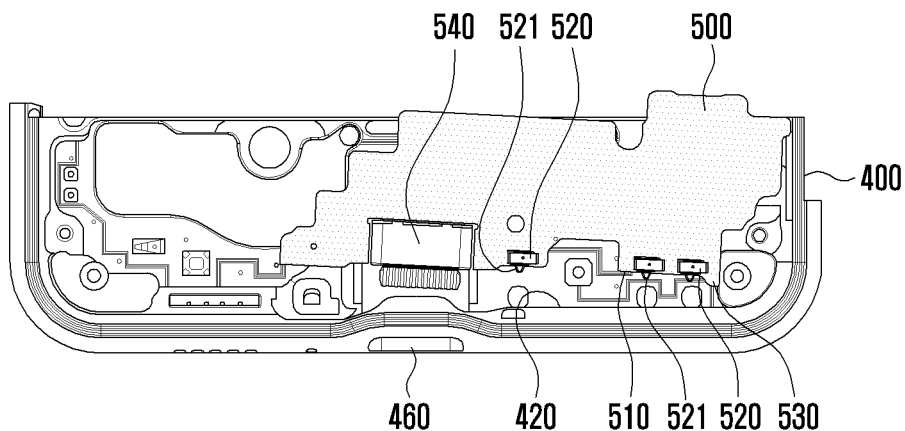
FIGS. 8A, 8B, and 8C are views illustrating an assembly aspect of a housing and a printed circuit board according to various embodiments of the disclosure.
Figure 8B:
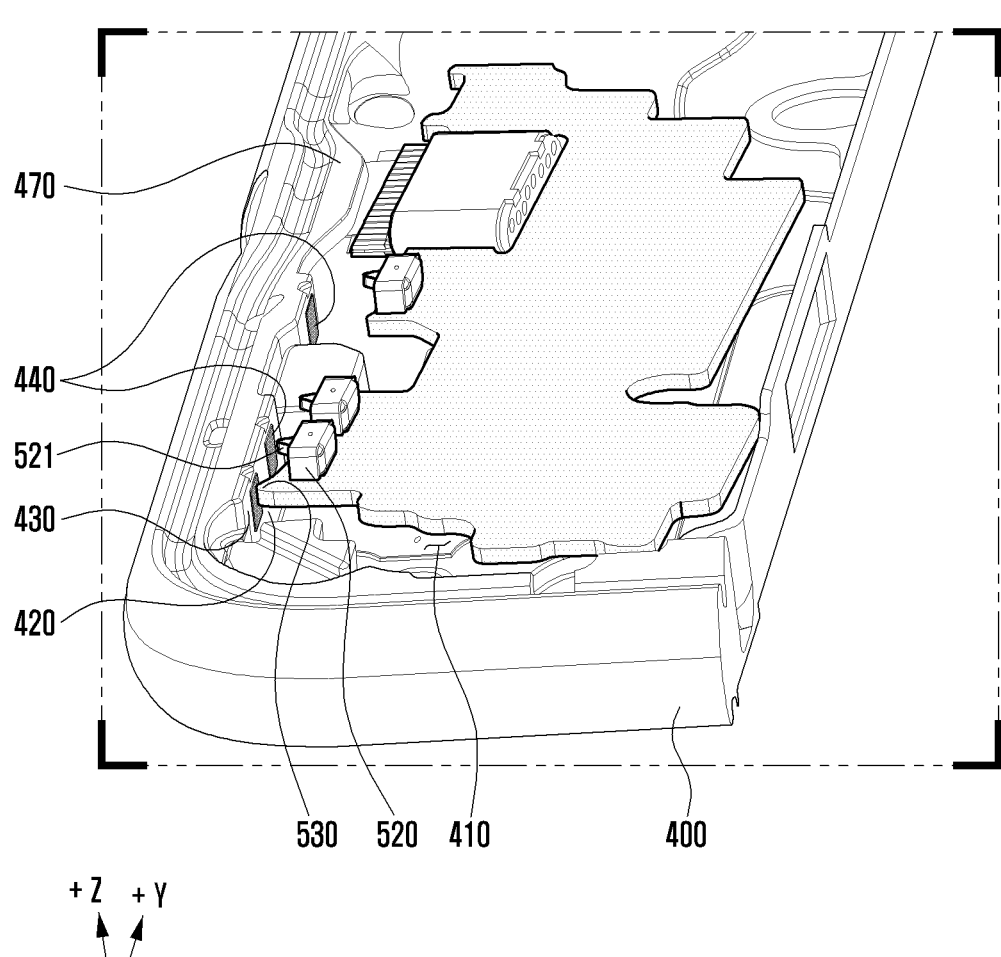
Figure 8C:
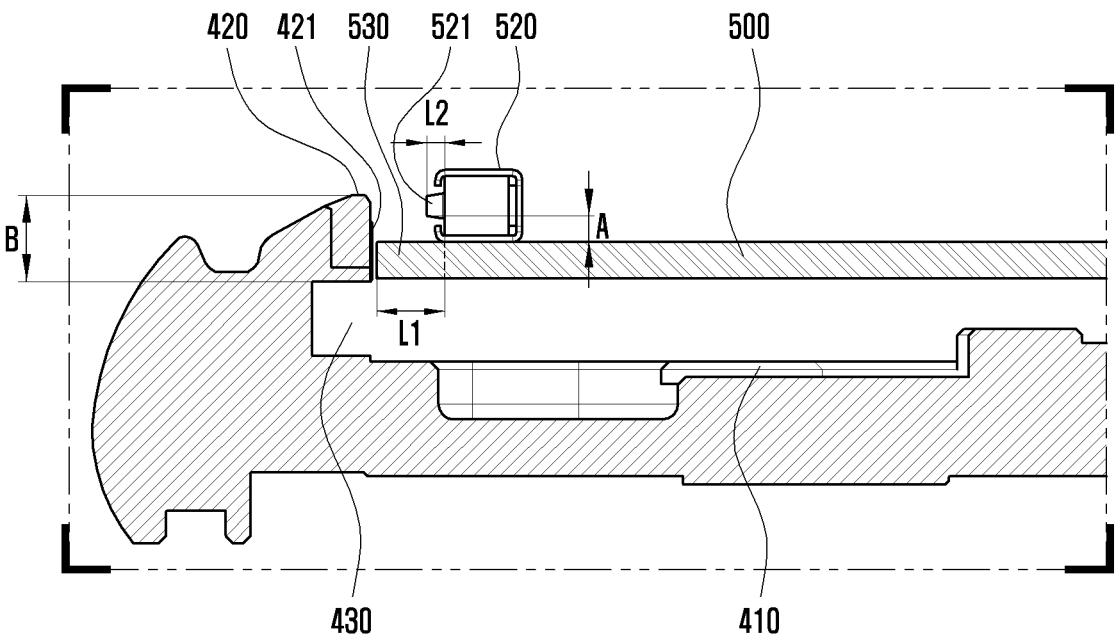
Figure 9A:
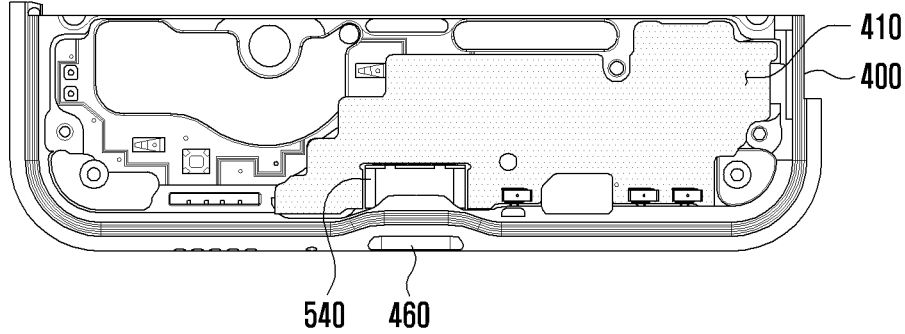
FIGS. 9A and 9B are views illustrating a state of assembling a housing and a printed circuit board according to various embodiments of the disclosure.
Figure 9B:
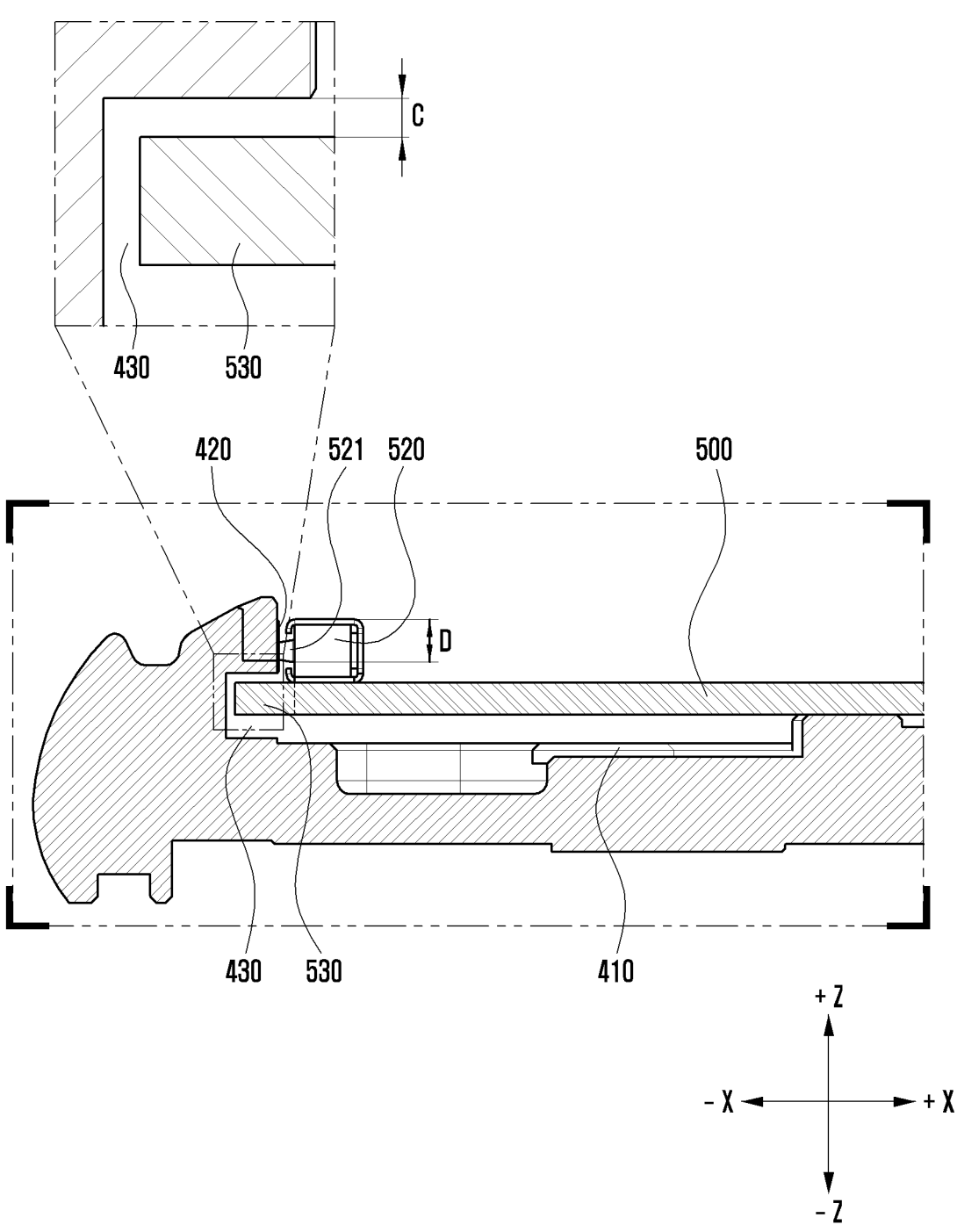

FIG. 7 illustrate an assembly aspect of a housing and a printed circuit board according to an embodiment of the disclosure. FIGS. 8A, 8B, and 8C illustrate an assembly aspect of a housing and a printed circuit board according to various embodiments of the disclosure. FIGS. 9A and 9B illustrate a state of assembling a housing and a printed circuit board according to various embodiments of the disclosure. At least one of components of the housing and the printed circuit board in FIGS. 7, 8A to 8C, 9A, and 9B may be similar to at least one of the components of the housing and the printed circuit board in FIGS. 4A to 4C, 5A, 5B, 6A, and 6B, so overlapping descriptions may be omitted hereinafter.

Referring to FIGS. 7, 8A, 8B, 8C, 9A, and 9B, according to various embodiments of the disclosure, the protrusion length of the shoulder portion 470 protruding at a position adjacent to the opening portion 460 formed in the inner wall portion 420 may be greater than the protrusion length of the clip portion 521 of the clip member 520. The protrusion length of the shoulder portion 470 may refer to the length (e.g., H1 in FIG. 4A) from the inner wall portion 420 to the end of the shoulder portion 470, and the protrusion length of the clip portion 521 may refer to the length (e.g., H2 in FIG. 5B) from the body portion 522 of the clip member 520 to the end of the clip portion 521. In order to prevent the connector 540 installed on the printed circuit board 500 from being caught by the shoulder portion 470, the printed circuit board 500 may have to be put in the second direction (e.g., the negative Z direction in FIG. 7) in a state where the outer wall portion 510 of the printed circuit board 500 is spaced apart from the inner wall portion 420 of the housing 400 in the positive X direction in FIG. 7. Because the protrusion length of the shoulder portion 470 is greater than the protrusion length of the clip portion 521, it is possible to prevent the clip portion 521 of the clip member 520 from being caught and damaged by the inner wall portion 420 of the housing 400 when the outer wall portion 510 of the printed circuit board 500 is spaced apart from the inner wall portion 420 of the housing 400 to such an extent that the connector 540 is not caught on the shoulder portion 470.

According to various embodiments of the disclosure, referring to FIGS. 8A and 8B, in a state where the outer wall portion 510 of the printed circuit board 500 is inclined with respect to the inner wall portion 420 of the housing 400 during the assembly process, the printed circuit board 500 may approach the mounting portion 410 of the housing 400 in the second direction. In this state, regardless of the protrusion lengths of the shoulder portion 470 and the clip portion 521, the connector 540 may not be caught on the shoulder portion 470, and only the clip portion 521 may be caught on the inner wall portion 420 of the housing 400. The protrusion guide 530 according to various embodiments of the disclosure may be formed to protrude from a position spaced apart from the clip portion 521 in the second direction. When the printed circuit board 500 approaches the housing 400 in the second direction, the protrusion guide 530 may first contact the inner wall portion 420 of the housing 400. In a state where the protrusion guide 530 is caught on the inner wall portion 420 of the housing 400, the printed circuit board 500 may be difficult to move in the second direction. A worker may move the printed circuit board 500 in the second direction in a state where the outer wall portion 510 of the printed circuit board 500 is spaced apart from the inner wall portion 420 of the housing 400. For this reason, the risk that the clip portion 521 is caught and damaged by the inner wall portion 420 may be reduced. The printed circuit board 500 according to various embodiments of the disclosure may allow assembly through other assembly path (e.g., moving the printed circuit board 500 in the second direction in a state where the outer wall portion 510 and the inner wall portion 420 are spaced apart) than a worker's assembly path (e.g., putting the printed circuit board 500 into the housing 400 in the second direction in a state where the outer wall portion 510 and the inner wall portion 420 are parallel). Therefore, it is possible to prevent damage to the clip portion 521 that may be caused in the process of assembling the printed circuit board 500 and the housing 400.

According to various embodiments of the disclosure, the position at which the guide groove 430 is formed in the inner wall portion 420 of the housing 400 may be determined as a position where the clip portion 521 of the clip member 520 is not caught and not damaged by the inner wall portion 420 of the housing 400 even when the protrusion guide 530 is inserted into the guide groove 430. Because the protrusion guide 530 is formed to protrude further than the clip portion 521 and formed to be spaced apart from the clip portion 521 in the second direction, the clip portion 521 may not contact the inner wall portion 420 of the housing 400 until the protrusion guide 530 is inserted into the guide groove 430. The protrusion guide 530 may prevent the clip portion 521 from being caught and damaged by the inner wall portion 420 of the housing 400. As such, the protrusion guide 530 may prevent the clip portion 521 of the clip member 520 from contacting the inner wall portion 420 of the housing 400 until it is inserted into the guide groove 430. For example, when the clip portion 521 of the clip member 520 is at a position of being elastically deformed by the inner wall portion 420 of the housing 400, the guide groove 430 may be formed at a position of accommodating the protrusion guide 530. The clip portion 521 of the clip member 520 may be elastically deformed by contacting the contact surface 421 of the inner wall portion 420. Therefore, when the clip portion 521 starts to come into contact with the contact surface 421 of the inner wall portion 420, the risk that the clip portion 521 is caught and damaged by the inner wall portion 420 can be reduced. In case that the clip portion 521 comes into contact with the contact surface 421 of the inner wall portion 420 when the protrusion guide 530 starts to be inserted into the guide groove 430, the clip portion 521 may not be caught and not be damaged by the inner wall portion 420.

For example, referring to FIG. 8C, the formation position of the guide groove 430 may be determined such that the distance B from the end of the inner wall portion 420 to the start portion of the guide groove 430 is greater than the distance A between the protrusion guide 530 and the clip portion 521. In case that the formation position of the guide groove 430 is determined in this way, the clip portion 521 may not be caught on the inner wall portion 420 before the protrusion guide 530 is inserted into the guide groove 430.

Referring to FIGS. 9A and 9B, in a state where the printed circuit board 500 is fully mounted on the mounting portion 410 of the housing 400, the clip portion 521 of the clip member 520 may be in contact with the pad portion 440 disposed on the inner wall portion 420 of the housing 400. In another embodiment of the disclosure, the clip portion 521 of the clip member 520 may directly contact the inner wall portion 420 of the housing 400. The connector 540 may be inserted into the opening portion 460 formed in the inner wall portion 420. The protrusion guide 530 may be inserted into the guide groove 430.

According to various embodiments of the disclosure, a position at which the guide groove 430 is formed may be determined such that a separation distance (e.g., C in FIG. 9B) between the guide groove 430 and the protrusion guide 530 is smaller than a distance (e.g., D in FIG. 9B) from a lower surface of the clip portion 521 to an upper surface of the clip member 520 in a state where the printed circuit board 500 is mounted on the mounting portion 410.

According to various embodiments of the disclosure, an electronic device may include a housing including a mounting portion and an inner wall portion extending in a first direction with respect to the mounting portion, a printed circuit board mounted on the mounting portion of the housing and including an outer wall portion disposed substantially parallel to the inner wall portion of the housing in a state of being mounted on the mounting portion of the housing, a clip member disposed at a position adjacent to the outer wall portion of the printed circuit board, electrically connected to the printed circuit board, and including a clip portion formed to protrude toward the inner wall portion to be in contact with the inner wall portion, a protrusion guide spaced apart from the clip portion in a second direction opposite to the first direction and formed to protrude from the outer wall portion of the printed circuit board toward the inner wall portion of the housing, and a guide groove formed in the inner wall portion of the housing to accommodate the protrusion guide in a state where the printed circuit board is mounted on the mounting portion of the housing.

In addition, the protrusion guide may be formed integrally with the printed circuit board.

In addition, the protrusion guide may be disposed at a position adjacent to the clip member.

In addition, the protrusion guide may be disposed on an edge portion of the outer wall portion of the printed circuit board.

In addition, the clip member may include a body portion installed on the printed circuit board, and the clip portion may extend in a direction parallel to the extending direction of the printed circuit board, be bent at least in part, and be fixed to the body portion at both ends thereof.

In addition, the clip portion may be elastically deformed in contact with the inner wall portion of the housing.

In addition, the electronic device may further include a connector disposed at a position adjacent to the outer wall portion of the printed circuit board and electrically connected to the printed circuit board, and an opening portion formed in the inner wall portion of the housing to receive the connector in a state where the printed circuit board is mounted on the mounting portion of the housing.

In addition, the electronic device may further include a shoulder portion adjacent to the opening portion in the first direction and protruding from the inner wall portion of the housing in a mounting direction of the printed circuit board.

In addition, the protrusion length of the shoulder portion may be greater than the protrusion length of the clip portion.

In addition, a formation position of the guide groove may be determined such that the protrusion guide is inserted into the guide groove at a position where the clip portion is elastically deformed by the inner wall portion of the housing.

In addition, the electronic device may further include a pad portion disposed at least in part on the inner wall portion of the housing, wherein the clip portion is elastically deformed in contact with the pad portion.

According to various embodiments of the disclosure, a printed circuit board may include an outer wall portion formed in the printed circuit board to be disposed substantially parallel to an inner wall portion of a housing, the inner wall portion extending in a first direction with respect to a mounting portion of the housing, a clip member disposed at a position adjacent to the outer wall portion, electrically connected to the printed circuit board, and including a clip portion formed to protrude toward the inner wall portion of the housing to be in contact with the inner wall portion, and a protrusion guide spaced apart from the clip portion in a second direction opposite to the first direction, formed to protrude from the outer wall portion toward the inner wall portion of the housing, and inserted into a guide groove formed in the inner wall portion of the housing, wherein the printed circuit board may be mounted at least in part on the mounting portion of the housing.

In addition, the protrusion guide may be formed integrally with the printed circuit board.

In addition, the protrusion guide may be disposed at a position adjacent to the clip member.

In addition, the protrusion guide may be disposed on an edge portion of the outer wall portion.

In addition, the clip member may include a body portion installed on the printed circuit board, and the clip portion may extend in a direction parallel to the extending direction of the printed circuit board, be bent at least in part, and be fixed to the body portion at both ends thereof.

In addition, the clip portion may be elastically deformed in contact with the inner wall portion of the housing.

In addition, the printed circuit board may further include a connector disposed at a position adjacent to the outer wall portion, electrically connected to the printed circuit board, and inserted into the opening portion formed in the inner wall portion of the housing.

According to an embodiment of the disclosure, an electronic device may include a front plate forming a first surface of the electronic device, a display exposed to the outside of the electronic device in a first direction through at least a portion of the front plate, a rear plate forming a second surface of the electronic device opposite to the first surface, a side bezel structure including a first support member combined at least in part with the display and disposed between the front and rear plates to be combined with the front and rear plates, a printed circuit board including a clip portion formed to be electrically connected to the side bezel structure and combined with the first support member, and a protrusion guide formed on the printed circuit board to be spaced apart from the clip portion in a second direction opposite to the first direction and protruding toward the side bezel structure, wherein at least a partial area of the side bezel structure may be electrically connected to the clip portion to form an antenna area.

In addition, the side bezel structure may include a guide groove formed in at least a part of the side bezel structure to receive the protrusion guide.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing including a mounting portion and an inner wall portion extending in a first direction (+Z) with respect to the mounting portion;
a printed circuit board mounted on the mounting portion of the housing and including a plane portion (±X, ±Y) and an outer wall portion, formed as a side portion of the printed circuit board, disposed substantially parallel to the inner wall portion of the housing; and
a clip member disposed on the plane portion (±X, ±Y) at a position adjacent to the outer wall portion, electrically connected to the printed circuit board, and including:
a body portion fixed on the plane portion (±X, ±Y) of the printed circuit board, and
a clip portion, partially disposed in the body portion, spaced apart from the plane portion (±X, ±Y) and formed to protrude toward the inner wall portion of the housing in a second direction (−X) substantially perpendicular to the first direction (+Z) to be in contact with the inner wall portion of the housing,
wherein the printed circuit board includes a protrusion portion protruding from the side portion of the printed circuit board toward the inner wall portion of the housing in the second direction (−X),
wherein the housing includes a groove, formed in the inner wall portion of the housing with a depth in the second direction (−X), to accommodate at least a part of the protrusion portion inserted into the groove in the second direction (−X) and overlapping with both an upper inner surface and a lower inner surface of the groove,
wherein the clip portion is formed to extend in a third direction (±Y) substantially perpendicular to the first direction (+Z) and the second direction (−X), and
wherein the clip portion is spaced apart from the printed circuit board in at least one of the first direction (+Z) or the third direction (±Y).

2. The electronic device of claim 1, wherein the protrusion portion is formed integrally with the printed circuit board.

3. The electronic device of claim 1, wherein the protrusion portion is disposed at a position adjacent to the clip member.

4. The electronic device of claim 1, wherein the protrusion portion is disposed on an edge portion of the outer wall portion of the printed circuit board.

5. The electronic device of claim 1, wherein the clip portion is bent at least in part, and is fixed to the body portion at both ends thereof.

6. The electronic device of claim 1, wherein the clip portion is elastically deformed in contact with the inner wall portion of the housing.

7. The electronic device of claim 1, further comprising:
a connector disposed at a position adjacent to the outer wall portion of the printed circuit board and electrically connected to the printed circuit board; and
an opening portion formed in the inner wall portion of the housing to receive the connector.

8. The electronic device of claim 7, further comprising:
a shoulder portion adjacent to the opening portion in the first direction (+Z) and protruding from the inner wall portion of the housing in a mounting direction of the printed circuit board.

9. The electronic device of claim 8, wherein a protrusion length of the shoulder portion is greater than a protrusion length of the clip portion.

10. The electronic device of claim 1, wherein a formation position of the groove is determined such that the protrusion portion is inserted into the groove at a position where the clip portion is elastically deformed by the inner wall portion of the housing.

11. The electronic device of claim 1, further comprising:
a pad portion disposed at least in part on the inner wall portion of the housing,
wherein the clip portion is elastically deformed in contact with the pad portion.

12. The electronic device of claim 1,
wherein the groove is concavely formed in the inner wall portion of the housing to accommodate the at least the part of the protrusion portion, and
wherein a concave portion of the groove is variable along a length of the groove according to an arc.

13. An electronic device comprising:
a printed circuit board including a surface extending in an X-Y plane of XYZ coordinate system and an outer wall portion formed as a side surface extending in a Y-Z plane;
a housing including a mounting portion formed to allow the printed circuit board to be mounted and an inner wall portion extending from the mounting portion in a Z direction and parallel to the side surface of the printed circuit board in a state of the printed circuit board being mounted on the mounting portion; and
a clip member including a clip portion and a body portion, the body portion fixed on the surface extending in the X-Y plane of the printed circuit board adjacent to the side surface thereof, with the clip portion configured to electronically connect a component on the printed circuit board and a portion of the housing operating as an antenna,
wherein the clip portion is configured to be pressed against the inner wall portion of the housing and elastically deform by bending,
wherein the bending of the clip portion is parallel with respect to the X-Y plane,
wherein the printed circuit board includes a protrusion protruding from the side surface of the printed circuit board in an X direction toward the inner wall portion of the housing in the state of the printed circuit board being mounted on the mounting portion, and
wherein the housing comprises a groove, formed in the inner wall portion of the housing with a depth in the X direction, to accommodate, in the state of the printed circuit board being mounted on the mounting portion, at least a part of the protrusion inserted into the groove in the X direction and overlapping with both an upper inner surface and a lower inner surface of the groove.

14. The electronic device of claim 13, wherein the protrusion is formed integrally with the printed circuit board.

15. The electronic device of claim 13, wherein the protrusion is disposed at a position adjacent to the clip member.

16. The electronic device of claim 13, wherein the body portion is electrically connected to the clip portion.

17. The electronic device of claim 13, wherein the clip portion is elastically deformed in contact with the inner wall portion of the housing in the state of the printed circuit board being mounted on the mounting portion.

18. The electronic device of claim 13, further comprising:
a connector disposed at a position adjacent to the side surface of the printed circuit board and electrically connected to the printed circuit board; and
an opening portion formed in the inner wall portion of the housing to receive the connector in the state of the printed circuit board being mounted on the mounting portion.

19. The electronic device of claim 13, wherein a formation position of the groove is determined such that the at least the part of the protrusion is inserted into the groove at a position where the clip portion contacts with the inner wall portion of the housing and is elastically deformed in the state of the printed circuit board being mounted on the mounting portion.

20. The electronic device of claim 13, further comprising:
a pad portion disposed at least in part on the inner wall portion of the housing,
wherein the clip portion contacts with the pad portion in the state of the printed circuit board being mounted on the mounting portion.

* * * * *